(12) United States Patent
Lu et al.

(10) Patent No.: US 6,866,988 B2
(45) Date of Patent: *Mar. 15, 2005

(54) METHODS FOR MEASURING PHOTORESIST DIMENSIONS

(75) Inventors: Shyue-Sheng Lu, Hsin-Chu (TW); Hong-Yuan Chu, Taichung (TW); Kuei-Shun Chen, Hsin-Chu (TW); Hua-Tai Lin, Yu-Kang (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 215 days.

This patent is subject to a terminal disclaimer.

(21) Appl. No.: 10/264,521

(22) Filed: Oct. 5, 2002

(65) Prior Publication Data

US 2004/0067448 A1 Apr. 8, 2004

(51) Int. Cl.⁷ .................................................. G03C 5/00
(52) U.S. Cl. .......................... 430/314; 430/30; 430/313; 438/14; 438/16
(58) Field of Search .................................. 430/313, 314, 430/30; 438/14, 16

(56) References Cited

U.S. PATENT DOCUMENTS

2004/0018648 A1 * 1/2004 Lu et al. ........................ 438/14

* cited by examiner

Primary Examiner—Christopher G. Young
(74) Attorney, Agent, or Firm—Tung & Associates

(57) ABSTRACT

A new and improved method for measuring dimensions of a photoresist pattern profile on a wafer substrate during photolithography for the fabrication of integrated circuits on the substrate. According to one embodiment, the method includes fixing the photoresist pattern profile on the substrate using a spin-on glass (SOG) procedure. In another embodiment, the method includes fixing the photoresist pattern profile on the substrate using a sputter oxide (SO) procedure. The fixed photoresist pattern is then subjected to a microscopy procedure, typically transmission electron microscopy (TEM), to measure the exact linewidth and other dimensions of the profile. The method prevents distortion of the profile during fixation and facilitates an accurate determination of the profile dimensions.

20 Claims, 2 Drawing Sheets

METHODS FOR MEASURING PHOTORESIST DIMENSIONS

FIELD OF THE INVENTION

The present invention relates to photolithography techniques used in the fabrication of integrated circuits on semiconductor wafer substrates. More particularly, the present invention relates to new and improved methods for accurately measuring the dimensions and sidewall profiles of photoresist on a semiconductor wafer substrate.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulative layers on the wafer and pattern the layers to form the circuits. The final yield of functional circuits on the wafer depends on proper application of each layer during the process steps. Proper application of those layers depends, in turn, on coating the material in a uniform spread over the surface of the wafer in an economical and efficient manner.

The photolithography step of semiconductor production is a complex process which can generally be divided into an eight-step procedure including vapor prime, in which the surface of the wafer substrate is cleaned, dehydrated and primed to promote adhesion between the photoresist material and the substrate surface; spin coating, in which a quantity of liquid photoresist is applied to the substrate either before or during rotation of the substrate; soft bake, in which most of the solvent in the resist is driven off by heating the substrate; alignment and exposure, in which a mask or reticle corresponding to the desired circuit pattern is aligned to the correct location on the substrate and light energy is applied through the mask or reticle onto the photoresist to define circuit patterns which will be etched in a subsequent processing step to define the circuits on the substrate; post-exposure bake; develop, in which the soluble areas of photoresist are dissolved by liquid developer, leaving visible islands and windows corresponding to the circuit pattern on the substrate surface; hard bake, in which the remaining photoresist solvent is evaporated from the substrate; and develop inspect, in which an inspection is carried out in order to verify the quality of the resist pattern. Resists which are determined to be defective can be removed through resist stripping for re-processing of the substrate. Those resists which are determined not to be defective are subjected to etching, in which those areas of a conductive layer on the substrate not covered by the photoresist are etched and those areas covered by the photoresist are protected, leaving the circuit pattern in the conductive layer on the substrate.

Conventional methods of inspecting the developed photoresist pattern include both in-line SEM (scanning electron microscopy) and off-line SEM. However, use of in-line SEM, an ADI (after development inspection) micrograph of which is generally indicated by reference numeral 10 in FIG. 1, reveals only a top view of the photoresist pattern, including the parallel ridges or islands 12 and intervening trenches 14. The in-line SEM is incapable of providing a detailed sidewall profile or line-width data of the photoresist pattern.

An ADI scanning electron micrograph of an off-line SEM is generally indicated by reference numeral 16 in FIG. 2 and shows the photoresist pattern profile, which includes a layer of photoresist 20 deposited on the wafer substrate 18 and the photoresist ridges or islands 22 extending from the photoresist layer 20 and separated by trenches 24. Unlike the in-line SEM, the off-line SEM is capable of providing both a sidewall profile and line-width data of the ridges 22 and trenches 24, including such information as the linewidth "A" of each ridge 22 and the width "B" of each trench 24, for example, as shown in FIG. 2. However, one of the limitations of the off-line SEM procedure is that the fixation process for fixing or stabilizing the photoresist profile on the wafer substrate 18 for scanning electron microscopy tends to alter, distort or damage the ridges or islands 22 of the photoresist. Consequently, the off-line SEM is incapable of providing the exact dimensions of the islands 22, the trenches 24 and other characteristics of the photoresist pattern profile. Accordingly, a new and improved method is needed for accurately measuring the exact linewidth and other dimensions of a photoresist pattern without damaging, distorting or altering the photoresist profile, which otherwise tends to render a faulty reading of the photoresist pattern dimensions.

An object of the present invention is to provide a new and improved method for measuring the various dimensions of a photoresist pattern.

Another embodiment of the present invention is to provide a new and improved method which prevents the necessity of scrapping wafers due to defective photoresist patterns.

Still another object of the present invention is to provide a new and improved method which expedites substrate processing.

Yet another object of the present invention is to provide a new and improved method which avoids distortion or damage of photoresist profiles on substrates in the fixing of a photoresist pattern for dimension measurement.

Yet another embodiment of the present invention is to provide a new and improved method for measuring dimensions of a photoresist pattern on a substrate, which method includes fixing or stabilizing the photoresist pattern profile and using transmission electron microscopy (TEM) to measure the linewidth and other dimensions of the profile.

Another object of the present invention is to provide a new and improved method for measuring dimensions of a photoresist pattern on a substrate, which method includes fixing or stabilizing the photoresist pattern profile on the substrate typically using a spin-on glass or a sputter oxide procedure and subjecting the fixed photoresist pattern profile to microscopy for measurement of the profile dimensions.

A still further object of the present invention is to provide a new and improved method which utilizes spin-on glass or sputter oxide to fix a photoresist pattern profile on a substrate and transmission electron microscopy to measure the various dimensions of the profile.

SUMMARY OF THE INVENTION

In accordance with these and other objects and advantages, the present invention is generally directed to a new and improved method for measuring dimensions of a photoresist pattern profile on a wafer substrate during photolithography for the fabrication of integrated circuits on the substrate. According to one embodiment, the method includes fixing the photoresist pattern profile on the substrate using a spin-on glass (SOG) procedure. In another embodiment, the method includes fixing the photoresist pattern profile on the substrate using a sputter oxide (SO) procedure. The fixed photoresist pattern is then subjected to a microscopy procedure, typically transmission electron microscopy (TEM), to measure the exact linewidth and other dimensions of the profile. The method prevents distortion of the profile during fixation and facilitates an accurate determination of the profile dimensions.

BRIEF DESCRIPTION OF THE DRAWINGS

The invention will now be described, by way of example, with reference to the accompanying drawings, in which.

DESCRIPTION OF THE PREFERRED EMBODIMENTS

Figure 5:
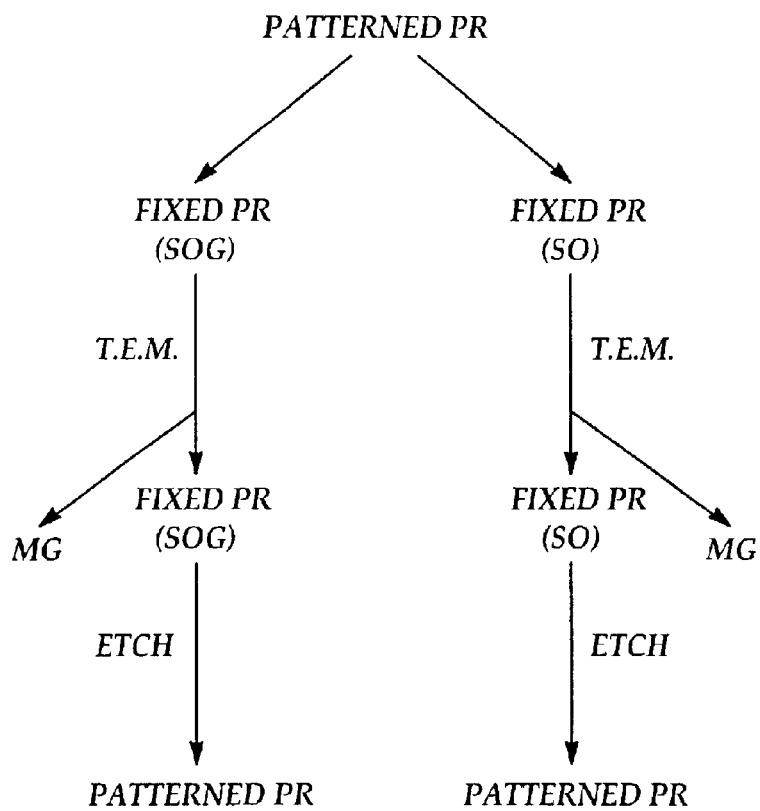
FIG. 5 is a flow diagram illustrating alternative methods of the present invention.

Referring initially to FIG. 5, the present invention comprises methods for fixing, or stabilizing, a patterned photoresist and then generating a micrograph, typically using transmission emission micrography (T.E.M.), for the develop inspect step of photolithography. The patterned photoresist is initially coated with a dielectric photoresist fixation material, hereinafter described, to form a fixed photoresist. According to one embodiment of the invention, the photoresist fixation material is a spin-on glass which is applied to the patterned photoresist using a conventional spin-on glass (SOG) technique to form the fixed photoresist. In another embodiment of the invention, the photoresist fixation material is an oxide which is applied to the patterned photoresist using a conventional sputter oxide (SO) technique to form the fixed photoresist. The SOG fixed photoresist and the SO fixed photoresist are then subjected to micrography, typically T.E.M., to generate a dimensionally accurate micrograph image of the fixed photoresist pattern. The SOG fixation technique and the SO fixation technique prevent distortion, damage or alteration of the various photoresist structures in the patterned photoresist, and thus, facilitate accurate measurement of the linewidth and other dimensions of the photoresist pattern profile.

Figure 1:
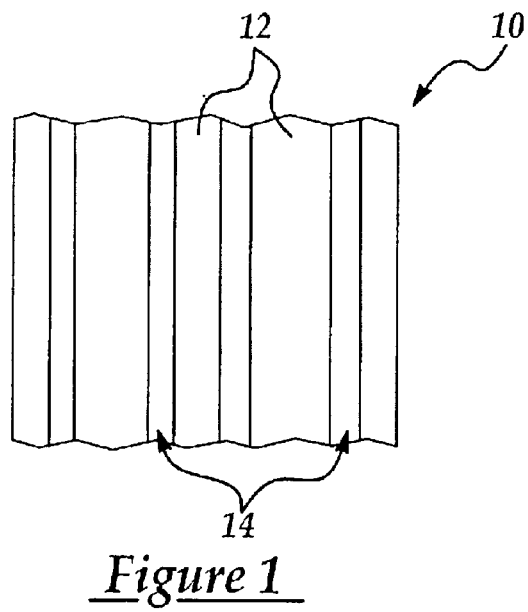
FIG. 1 illustrates a typical in-line, ADI (after development inspection) scanning electron micrograph of a photoresist pattern fixed on a substrate according to conventional methods.
Figure 2:
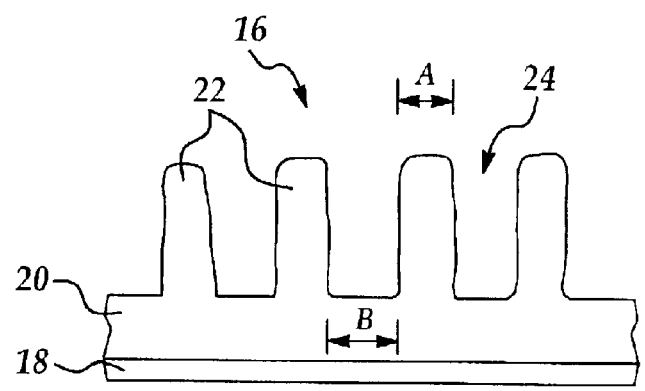
FIG. 2 illustrates a typical off-line, ADI scanning electron micrograph of a photoresist pattern fixed on a substrate according to conventional methods.
Figure 3:
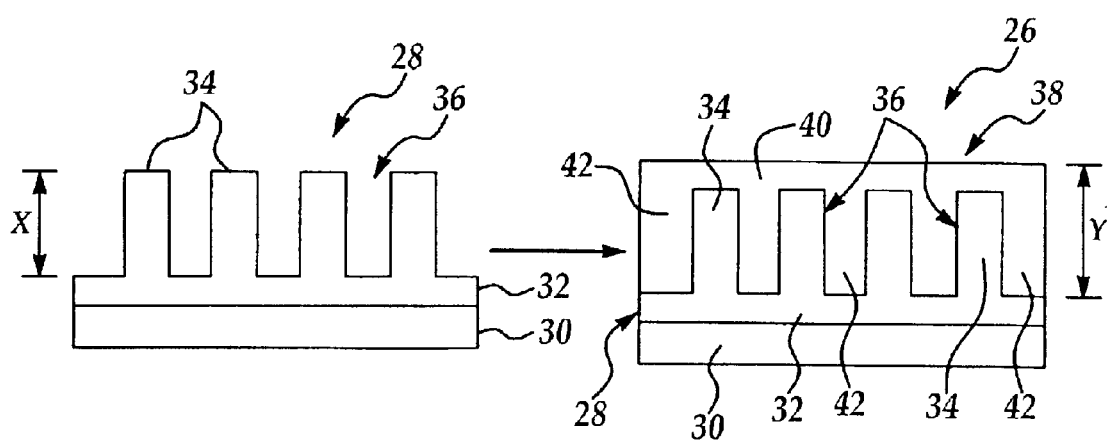
FIG. 3 is a cross-sectional, schematic view of a substrate with a photoresist pattern formed thereon, more particularly illustrating fixation of the photoresist pattern according to a method of the present invention.

Referring next to FIG. 3, the patterned photoresist 28 is formed on a wafer substrate 30 and includes a photoresist layer 32 which was previously deposited on the wafer substrate 30 typically using conventional spin-coating techniques. Multiple ridges or islands 34, separated by trenches 36, are typically formed in the photoresist layer 32 typically using conventional photoresist developing techniques. However, it is understood that the patterned photoresist 28 may have components and configurations in addition to or other than the islands 34 and trenches 36. According to the method of the present invention, a dielectric photoresist fixation material 38 is applied to the patterned photoresist 28 to form a fixed photoresist 26. The fixed photoresist 26 typically includes plugs 42 that extend downwardly from an upper layer 40 and fill the trenches 36 between adjacent islands 34 of the patterned photoresist 28. As heretofore described with respect to FIG. 5, in one embodiment of the invention the photoresist fixation material 38 is a spin-on glass (SOG) which is applied to the patterned photoresist 28 according to conventional spin-on glass techniques known by those skilled in the art. Spin-on glass methods generally involve the placement of a pool or puddle (not shown) of a solution including a silicate or other precursor and a solvent such as an alcohol at the center of the patterned photoresist 28. The patterned photoresist 28 is then rotated to uniformly distribute the solution over the surface of the patterned photoresist 28. During rotation of the patterned photoresist 28, the solvents evaporate and residual material, including silicon dioxide, for example, forms the layer 40 which covers the islands 34 and the extending plugs 42 which fill the trenches 36. In another embodiment of the invention, the photoresist fixation material 38 is an oxide which is applied to the patterned photoresist 28 according to conventional sputter oxide (SO) techniques known by those skilled in the art. Sputter oxide methods generally involve sputtering of an oxide film from an oxide-coated target (not shown) onto the surface of the patterned photoresist 28, such that the oxide forms the deposited layer 40 and the extending plugs 42 that fill in the trenches 36 of the patterned photoresist 28.

Figure 4:
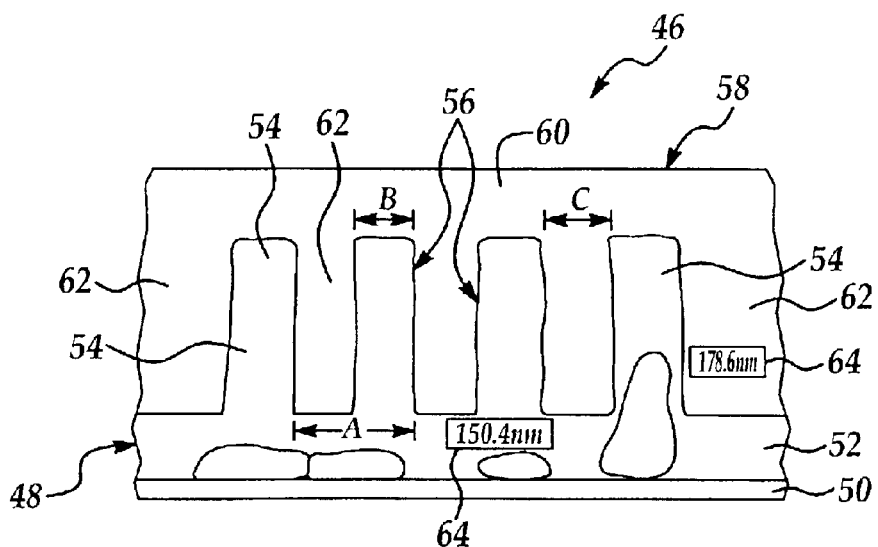
FIG. 4 illustrates an ADI transmission electron micrograph of the fixed photoresist pattern of FIG. 3, according to the method of the present invention.

As heretofore described with respect to the flow diagram of FIG. 5, the fixed photoresist 26, coated with the photoresist fixation material 38 which may be either spin-on glass or oxide, is subjected to transmission electron micrography (T.E.M.), using conventional T.E.M. techniques which are known by those skilled in the art, to generate a transmission electron micrograph image 46, which is shown in FIG. 4. The transmission electron micrograph image 46 includes a substrate image 50 which accurately reflects the dimensions of the substrate 30; a patterned photoresist profile image 48 which accurately reflects the patterned photoresist 28 and includes a photoresist layer image 52 that reflects the dimensions of the photoresist layer 32 and island images 54 that reflect the dimensions of the respective islands 34; and a fixation material image 58 which accurately reflects the photoresist fixation material 38 and includes a layer image 60 that reflects the dimensions of the layer 40 and plug images 62 that reflect the dimensions of the respective plugs 34. Measurement indicia 64 are typically provided on the micrograph image 46 to indicate such dimensions as the linewidth "B" of the islands and the width "C" of the trenches, as well as the pitch "A" between the border of one island and the opposite border of the adjacent island. Various other indicia indicating other dimensions of the photoresist pattern may be further included in the micrograph image 46.

After the micrograph image 46 is generated and the various dimensions of the patterned photoresist 28 are obtained, the glass or oxide photoresist fixation material 58 is etched from the patterned photoresist 28 using conventional etching techniques. The linewidth data and other dimensions obtained from the micrograph image 46 may then be used to optimize the various system parameters for forming a patterned photoresist 28 having the desired linewidths and other dimensions. Referring again to FIG. 3, each of the ridges or islands 34 typically has a height or thickness "X" of about 4,000 angstroms for a photoresist fixation material 38 having a thickness "Y" of from about 5,000 angstroms to about 8,000 angstroms. A thickness "X" of 4,000 angstroms for the islands 34 is needed to prevent excess etching of the islands 34, since the etching procedure for removing the dielectric photoresist fixation material 38 from the patterned photoresist 28 removes some of the photoresist from the islands 34 as well.

While the preferred embodiments of the invention have been described above, it will be recognized and understood that various modifications can be made in the invention and the appended claims are intended to cover all such modifications which may fall within the spirit and scope of the invention.

What is claimed is:

1. A method for measuring dimensions of a patterned photoresist, comprising the steps of:

forming a fixed photoresist comprising a photoresist fixation material on said patterned photoresist by subjecting said patterned photoresist to a spin-on glass process; and generating a micrograph image from said fixed photoresist.

2. The method of claim 1 wherein said generating a micrograph image from said fixed photoresist comprises subjecting said fixed photoresist to transmission electron micrography.

3. The method of claim 1 wherein said patterned photoresist comprises a plurality of islands and a plurality of trenches between said plurality of islands.

4. The method of claim 3 wherein said generating a micrograph image from said fixed photoresist comprises subjecting said fixed photoresist to transmission electron micrography.

5. The method of claim 3 wherein said plurality of islands each has a thickness of about 4,000 angstroms.

6. The method of claim 5 wherein said generating a micrograph image from said fixed photoresist comprises subjecting said fixed photoresist to transmission electron micrography.

7. The method of claim 5 wherein said photoresist fixation material has a thickness of about 5,000 angstroms to about 8,000 angstroms.

8. The method of claim 7 wherein said generating a micrograph image from said fixed photoresist comprises subjecting said fixed photoresist to transmission electron micrography.

9. A method for measuring dimensions of a patterned photoresist, comprising the steps of:

forming a fixed photoresist comprising a photoresist fixation material on said patterned photoresist by subjecting said patterned photoresist to an oxidation process; and generating a micrograph image from said fixed photoresist.

10. The method of claim 9 wherein said generating a micrograph image from said fixed photoresist comprises subjecting said fixed photoresist to transmission electron micrography.

11. The method of claim 9 wherein said patterned photoresist comprises a plurality of islands and a plurality of trenches between said plurality of islands.

12. The method of claim 11 wherein said generating a micrograph image from said fixed photoresist comprises subjecting said fixed photoresist to transmission electron micrography.

13. The method of claim 11 wherein said plurality of islands each has a thickness of about 4,000 angstroms.

14. The method of claim 13 wherein said generating a micrograph image from said fixed photoresist comprises subjecting said fixed photoresist to transmission electron micrography.

15. The method of claim 13 wherein said photoresist fixation material has a thickness of about 5,000 angstroms to about 8,000 angstroms.

16. The method of claim 15 wherein said generating a micrograph image from said fixed photoresist comprises subjecting said fixed photoresist to transmission electron micrography.

17. A method for measuring dimensions of a patterned photoresist, comprising the steps of:

forming a fixed photoresist comprising a photoresist fixation material on said patterned photoresist by subjecting said patterned photoresist to a process selected from the group consisting of spin-on-glass process and sputter oxide process;

generating a micrograph image from said fixed photoresist; and etching said photoresist fixation material from said fixed photoresist to define said patterned photoresist.

18. The method of claim 17 wherein said generating a micrograph image from said fixed photoresist comprises subjecting said fixed photoresist to transmission electron micrography.

19. The method of claim 17 wherein said patterned photoresist comprises a plurality of islands and a plurality of trenches between said plurality of islands.

20. The method of claim 19 wherein said plurality of islands each has a thickness of about 4,000 angstroms and said photoresist fixation material has a thickness of about 5,000 angstroms to about 8,000 angstroms.

* * * * *